United States Patent [19]
Kuroda

[11] Patent Number: 5,331,514
[45] Date of Patent: Jul. 19, 1994

[54] INTEGRATED-CIRCUIT PACKAGE

[75] Inventor: Masao Kuroda, Aichi, Japan

[73] Assignee: NGK Spark Plug Co., Ltd., Aichi, Japan

[21] Appl. No.: 923,512

[22] Filed: Aug. 3, 1992

[30] Foreign Application Priority Data

Aug. 5, 1991 [JP] Japan .................................. 3-195311

[51] Int. Cl.⁵ .............................................. H05K 7/02
[52] U.S. Cl. .................... 361/760; 361/744; 361/792; 439/66; 439/91; 174/255; 257/686
[58] Field of Search ............... 361/396, 400, 412, 414, 361/744, 760, 784, 792; 174/255, 258; 257/686, 688, 690, 684; 439/66, 91

[56] References Cited

U.S. PATENT DOCUMENTS

4,811,082  3/1989  Jacobs et al. ................... 357/80

OTHER PUBLICATIONS

IBM Technical Disclosure Bulletin, Reduced Coupled Noise Technique for Engineering Changes, Mar. 1986, vol. 26, No. 10, pp. 4618–4619.

Kraus et al., IBM Technical Disclosure Bulletin, Metallized Ceramic and Multi-Level Hybrid Fan-Out Technique, Mar. 1984, vol. 26, No. 10A, pp. 5063–5064.

Norman Goldberg, "Design of Thin Film Multichip Modules," The International Journal for Hybrid Microelectronics, vol. 4, No. 2, Oct. 1981, pp. 289–295.

Takeshi Sekiguchi et al., "A Multi-Chip Packages GaAs 16×16 Bit Parallel Multiplier", Optoelectronics Laboratories, pp. 1–4.

Yasumasa Noguchi et al., "Analysis of Characteristics of the Shielded–Coplanar Waveguide by Conformal Mapping Method," Journal of Electro Communication Society, vol. J60–B, No. 8, 1977, pp. 561–566.

*Primary Examiner*—Leo P. Picard
*Assistant Examiner*—Young Whang
*Attorney, Agent, or Firm*—Finnegan, Henderson Farabow, Garrett & Dunner

[57] ABSTRACT

An object to the present invention is to provide an integrated-circuit package in which crosstalk can be reduced and impedance matching can be made. According to the present invention, conductive poles are grid-like arranged equidistantly in rows respectively in the vertical and transversal directions of an insulating substrate. The conductive poles are classified into signal conductive poles which are electrically connected to electrodes of the integrated circuit and the mother board, and earthed ground conductive poles arranged so as to adjacently surround the signal conductive poles.

7 Claims, 4 Drawing Sheets

INTEGRATED-CIRCUIT PACKAGE

BACKGROUND OF THE INVENTION

The present invention relates to an integrated-circuit package having conductive poles which are electrically connected to an integrated circuit mounted therein.

Recently, it has been required to make an insulating substrate of an integrated-circuit package to provide a narrower pitch of conductive poles thereby to enable the mounted integrated circuit to be higher in its speed and its density and to be smaller in its size.

When the pitch of the conductive poles is made narrow, a crosstalk noise is generated between adjacent conductive poles thereby making it difficult to make the density of the conductive poles high. Further, causing another problem, i.e., the conductive poles vary in impedance, signal reflection noise is generated to deteriorate the signal transmission characteristic.

SUMMARY OF THE INVENTION

The present invention has been attained in view of the circumstances described above, and an object thereof is to provide an integrated-circuit package in which the density of conductive poles can be made high, a crosstalk noise between adjacent conductive poles can be reduced, and impedance matching of the conductive poles can be made.

The integrated-circuit package according to the present invention employs the following technical means and comprises a plate-like insulating substrate made of an insulating material and a number of conductive poles arranged grid-like so as to penetrate the insulating substrate. Of those conductive poles, at least one signal conductive pole for signal transmission is adjacently surrounded by conductive poles which are earthed ground conductive poles.

Here, the word "earthed" means "AC earthed". The ground conductive poles may be connected to either a ground layer or a power source layer. Further, the insulating substrate may have a single layer or of multiple layers, or it may include a conductive layer therein.

In the integrated-circuit package of the present invention having such a configuration as described above, a signal conductive pole surrounded by ground conductive poles is shielded by the surrounding ground conductive poles.

The integrated-circuit package according to the present invention has such a structure that a signal conductive pole is shielded by ground conductive poles surrounding the signal conductive pole, so that even if the interval between adjacent conductive poles is made narrower to make the density of the conductive poles high, a crosstalk noise can be reduced in comparison with the conventional art. Further, the conductive poles can be matched in characteristic impedance, so that a reflection noise of a signal can be reduced to thereby improve the signal transmission characteristic.

Further, the density of the conductive poles is made so high that the interval of the ground conductive poles surrounding each signal conductive pole is made narrower thereby to improve the shielding effect.

DETAILED DESCRIPTION OF THE PREFERRED EMBODIMENTS

Figure 1:
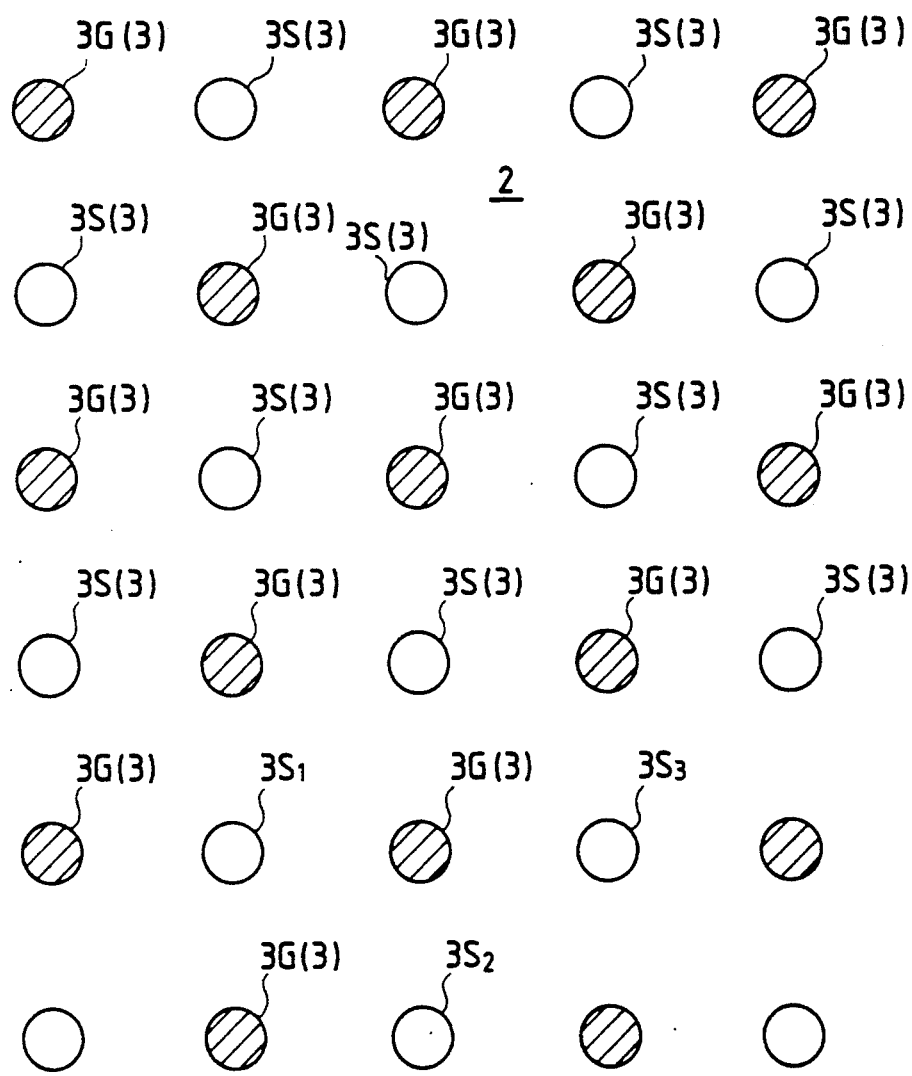
FIG. 1 is a plan view showing a main portion of an insulating substrate included in an integrated-circuit package of a first embodiment of the present invention.

The integrated-circuit package according to the present invention will be described on the basis of an embodiment shown in the drawings.

Figure 2:
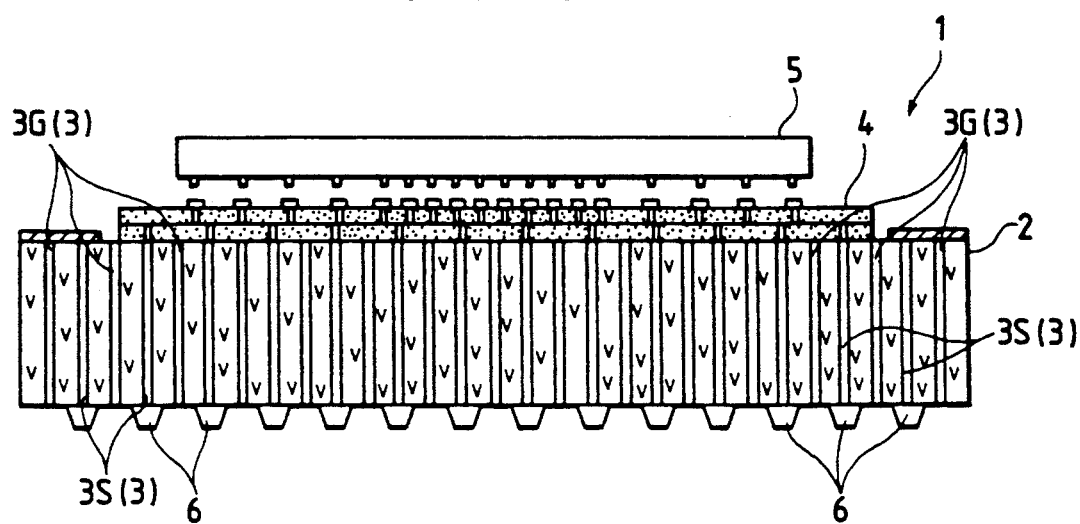
FIG. 2 is a schematic section of the integrated-circuit package of FIG. 1.

FIG. 1 is a plan view showing a main portion of an integrated-circuit package of the present invention, and FIG. 2 is a schematic section of the integrated-circuit package of FIG. 1. An integrated-circuit package 1 has a ceramic insulating substrate 2. The insulating substrate is provided with a number of conductive poles 3 penetrating the insulating substrate 2. A number of the conductive poles 3 are grid-like arranged equidistantly in rows respectively in the vertical and transversal directions of the insulating substrate 2 (for example, with via pitch of 100–800 $\mu$m).

Further, an insulating layer 4 of polyimide having signal leading wirings formed thereon is formed on one surface of the integrated-circuit package 1. A flip chip 5 which is an integrated circuit is mounted on the surface of the insulating layer 4. After the flip chip 5 is mounted on the insulating layer 4, a sealing cap (not shown) is fixed on the peripheral edge of the insulating substrate 2 so as to seal the flip chip 5. The insulating layer 4 may be made of another material such as a ceramic material or the like organic material in place of polyimide.

The insulating substrate 2 is formed in such a manner that a single layer of a not-yet sintered ceramic such as AlN, $Al_2O_3$, mullite, glass ceramic, crystallized glass, $Si_3N_4$, or the like or a lamination of such layers is sintered so as to have a thickness of, for example, about 0.5–4 mm.

As shown in FIG. 1, the conductive poles 3 are classified into signal conductive poles 3S (not-hatched conductive poles in FIG. 1) which are electrically connected to the integrated circuit through the signal leading wirings of the insulating layer 4, and earthed ground conductive poles 3G (hatched conductive poles in FIG. 1). The earthed ground poles 3G are arranged to surround adjacent signal conductive poles 3S so as to provide an earthed ground about each of the signal conductive poles 3S.

Each of the ground conductive poles 3G is electrically connected at a portion (not shown) thereof to a ground electrode or a power electrode which is provided on a mother board on which the integrated-circuit package is mounted, or to a ground electrode or a power electrode of the integrated circuit. Further, bumps 6 which are electrically connected to the electrodes of the mother board are formed at respective ends of the signal conductive poles 3S.

A method of manufacturing the insulating substrate 2 will now be briefly described. A thin plate-like green sheet is made of, for example, AlN, $Al_2O_3$, mullite, or the like, and the green sheet is sintered in a furnace to thereby obtain a ceramic sintered body (the insulating substrate 2). Next, holes (each having an inner diameter of about 100–200 μm) through which the conductive poles 3 are to be provided are formed grid-like in the sintered body through laser working technique, punching on the green sheet or the like. Succeedingly, Al, Cu, Ag, or the like is filled into each of the thus formed holes through sputtering and plating technique, or through fused metal pouring technique to thereby form the conductive poles 3. After that, the bumps 6 are formed at the respective ends of the conductive poles 3.

Figure 3:
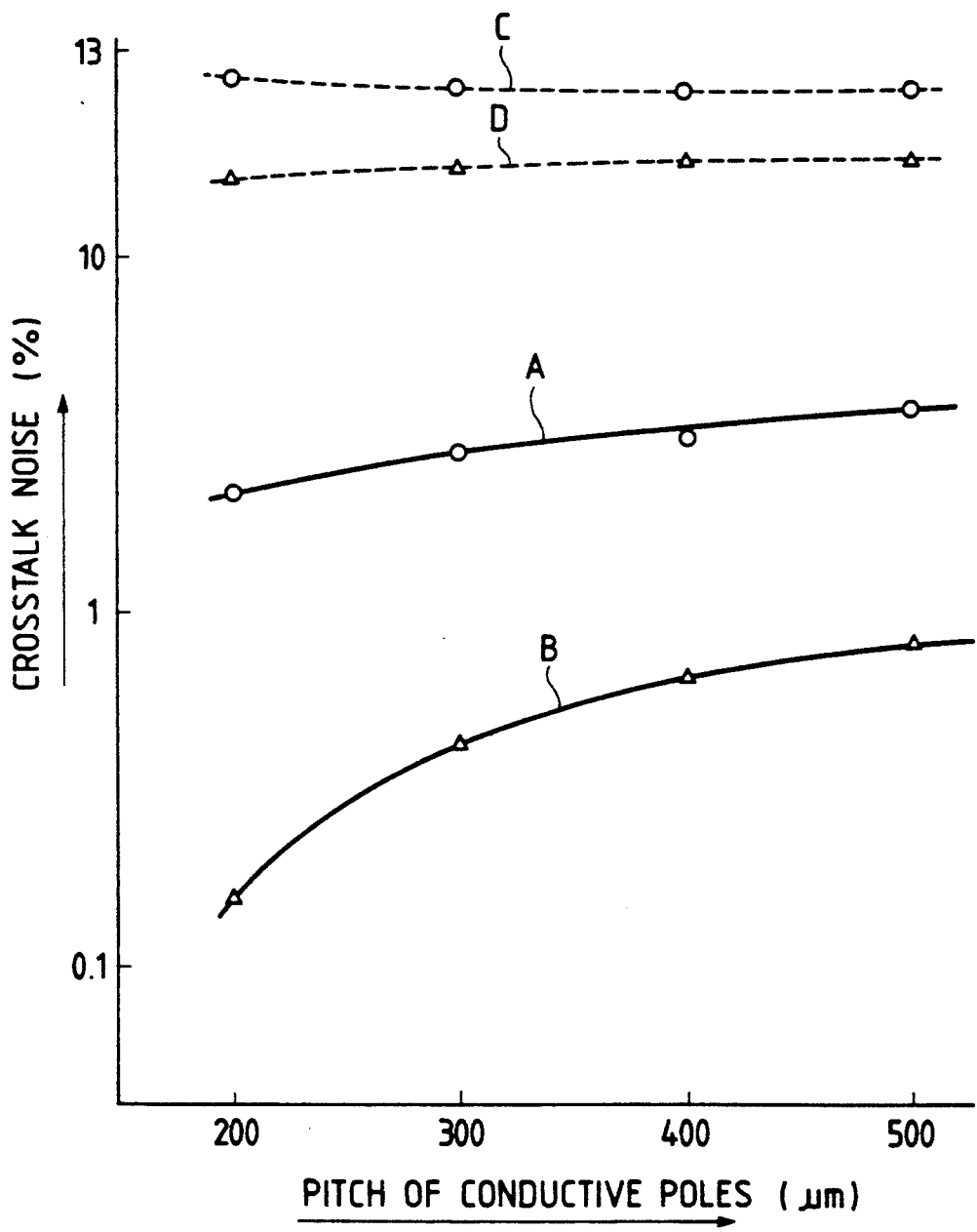
FIG. 3 is a graph showing the relation between the pitch of conductive poles and crosstalk.

The relation between the pitch of the conductive poles 3 and the crosstalk is shown in a graph of FIG. 3. The material of an insulating substrate 2 used in the experiment was 92% alumina, and the diameter of each conductive pole 3 was 100 $\wedge$.μm. In FIG. 3, a solid curve A indicates the crosstalk between a first signal conductive pole 3S2 and a second signal conductive pole 3S2 which is the nearest one to the first signal conductive pole 3S1 while the pitch of the conductive poles 3 was made to vary in a range of from 200 to 500 μm. A solid curve B indicates the crosstalk between the first signal conductive pole 3S1 and a third signal conductive pole 3S3 which is provided adjacently to the first signal conductive pole 3S1 through a ground conductive pole 3G. For comparison, a broken line C indicates the crosstalk between the first signal conductive pole 3S1 and the second signal conductive pole 3S2 in the state where the ground conductive poles 3G are not earthed to the ground. A broken line D indicates the crosstalk between the first signal conductive pole 3S1 and the third signal conductive pole 3S3 in the state where the ground conductive poles 3G are not earthed. The measurement was directly performed by a TRD method.

Figure 4:
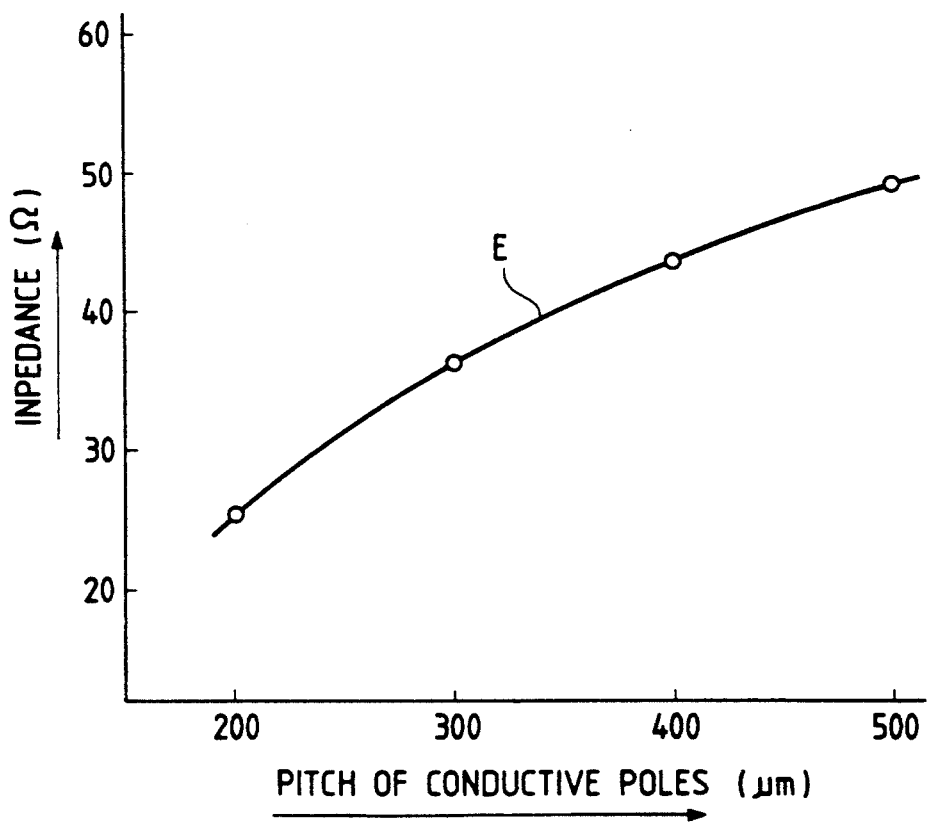
FIG. 4 is a graph showing the relation between the pitch of the conductive poles and characteristic impedance.

FIG. 4 is a graph showing the relation between the pitch of the conductive poles 3 and the characteristic impedance of the conductive poles 3. Similarly to the above experiment, the material of the insulating substrate 2 used in the experiment was 92% alumina, and the diameter of each of the conductive poles 3 was 100 μm. In FIG. 4, a solid line E indicates the result of measurement of the characteristic impedance of the signal conductive pole 3S while the pitch of the conductive poles 3 is changed in a range of from 200 to 500 μm. The measurement was also directly performed by the TRD method.

As shown in the graph of FIG. 3, in the integrated-circuit package 1 of the embodiment, the earthed ground conductive poles 3G are arranged to surround the signal conductive poles 3S, so that crosstalk can be extremely reduced. As the pitch of the signal conductive poles 3S is made smaller, each of the signal conductive poles 3S is surrounded more closely by the ground conductive poles 3G so that the structure approaches a quasi-coaxial one. Accordingly, crosstalk can be made small so that it becomes extremely advantageous in making the density of the conductive poles 3 high.

Further, the impedance of the signal conductive poles 3S can be selected in accordance with the pitch of the conductive poles 3, so that the reflection noise of a signal can be reduced. Accordingly, the integrated-circuit package 1 can be made superior in signal transmission characteristic.

Although an example in which the ground conductive poles are provided among the conductive poles (the signal conductive poles) of a conventional integrated-circuit package has been described in the above embodiment, an electrode corresponding to each of the ground conductive poles may be provided in an integrated circuit or a polyimide layer to be mounted.

Figure 5:
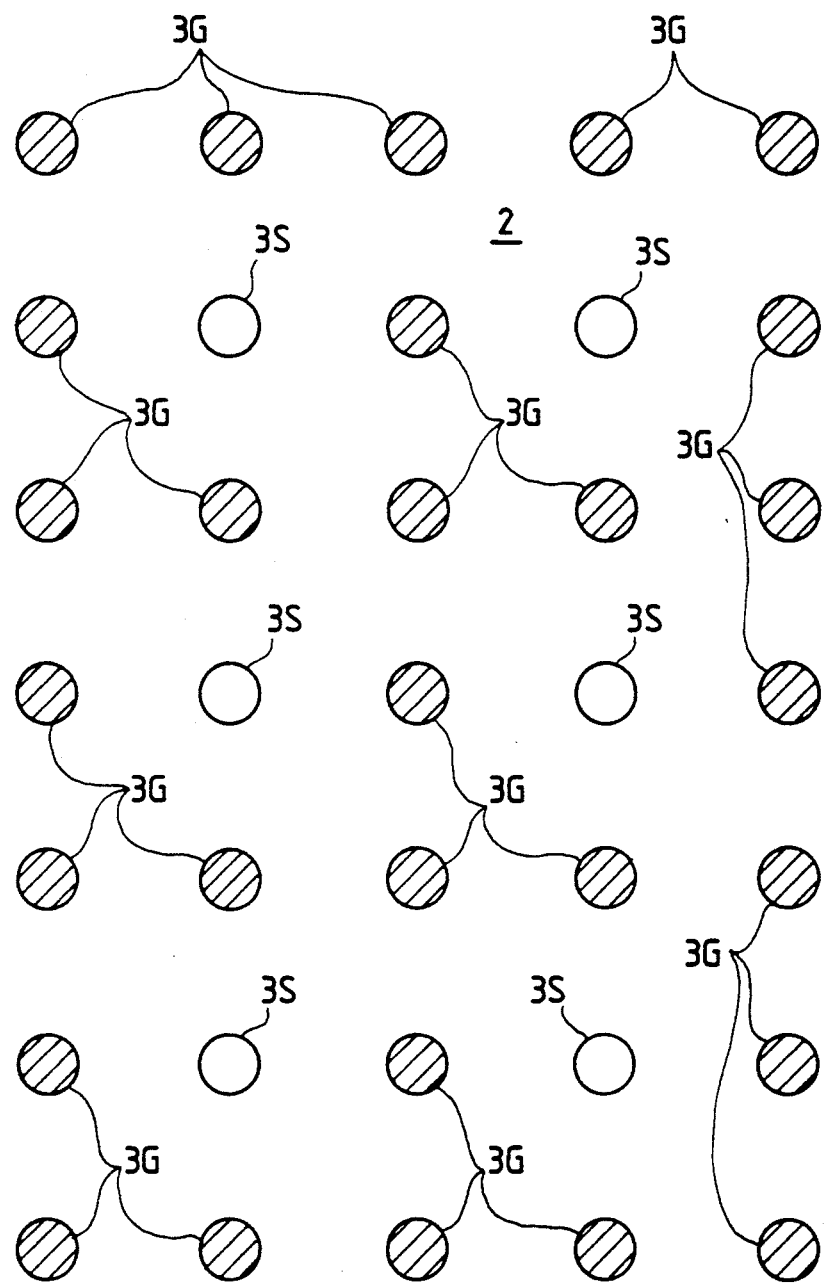
FIG. 5 is a plan view showing a main portion of an insulating substrate in another embodiment of the present invention.

Although an example in which conductive poles which are the nearest to each of the signal conductive poles 3S are made to be the ground conductive poles 3G has been described in the above embodiment, the conductive poles may be arranged so that all the conductive poles surrounding each signal conductive pole 3S are made to be the ground conductive poles 3G as shown in FIG. 5.

Although an example of an integrated-circuit package in which conductive poles are arranged grid-like so that if adjacent ones of the conductive poles are connected a square is formed has been described in the above embodiment, the present invention may be applied to any other grid-like integrated-circuit package in which if conductive poles adjacent to each other are connected a triangle, a pentagon, or any other shape is formed.

Although an example in which the present invention is applied to a ceramic insulating substrate has been described in the above embodiment, the present invention may be applied to other insulating substrates made of any other insulating materials such as polyimide or the like.

Although an example in which holes are formed in an insulating substrate through a laser technique has been described in the above embodiment, holes may be formed through drill working or punching working before ceramic is sintered.

Although an example in which bumps are provided on an insulating substrate has been described, the present invention may be applied to a PGA package in which pins are bonded.

Although a flip chip has been illustrated as an example of the integrated circuit to be mounted, the present invention may be applied to an integrated-circuit package mounting an integrated circuit in which connection is made by means of TAB or wire bonding.

What is claimed is:

1. An integrated circuit package comprising:
   a plate-like insulating substrate; and
   a plurality of conductive poles including signal conductive poles and ground conductive poles, said signal and ground conductive poles penetrated into said plate-like insulating substrate,
   wherein at least one of said signal conductive poles is surrounded by at least some of said ground conductive poles.

2. The integrated circuit package as claimed in claim 1, wherein said conductive poles are arranged equidistantly in rows respectively in vertical and transversal directions of said insulating substrate.

3. The integrated circuit package as claimed in claim 2, wherein said ground conductive poles are located to form a reference square about said one signal conductive pole.

4. The integrated circuit package of claim 2, wherein said conductive poles are located to form a reference polygon about said one signal conductive pole.

5. The integrated circuit package as claimed in claim 1, further comprising:
   an insulating layer disposed on one side of said plate like substrate; and
   an integrated circuit mounted on a surface of said insulating layer,
   wherein said ground poles extend between said insulating layer and said integrated circuit through said plate like insulating substrate.

6. An integrated circuit package comprising:

a plate-like insulating substrate; and
a plurality of conductive poles including signal conductive poles and ground conductive poles, said signal conductive poles penetrated into said plate-like insulating substrate,
wherein one of said ground conductive poles is disposed between said signal conductive poles adjacently arranged.

7. The integrated circuit package of claim 1 wherein each of said signal conductive poles is surrounded by ground conductive poles.

* * * * *

UNITED STATES PATENT AND TRADEMARK OFFICE
CERTIFICATE OF CORRECTION

PATENT NO. : 5,331,514
DATED : July 19, 1994
INVENTOR(S) : Masao KURODA

Page 1 of 4

It is certified that error appears in the above-indentified patent and that said Letters Patent is hereby corrected as shown below:

Claim 1, column 4, line 40 delete the "and".

Claim 1, column 4, line 43 after "poles" insert --being--.

Claim 1, column 4, line 44 change "substrate," to --substrate; and--;

Claim 1, column 4, line 45 change "is" to --being--.

Claim 1, column 4, line 46 change "at least one of said" to --predetermined--.

Claim 1, column 4, line 47 change "poles" to --and having an impedance based on a pitch of the signal conductive poles to reduce signal reflection noise.--

Claim 5, column 4, line 59 change "The" to --An--, and delete "as claimed in claim".

UNITED STATES PATENT AND TRADEMARK OFFICE
CERTIFICATE OF CORRECTION

PATENT NO. : 5,331,514
DATED : July 19, 1994
INVENTOR(S) : Masao KURODA

It is certified that error appears in the above-indentified patent and that said Letters Patent is hereby corrected as shown below:

Claim 5, column 4, line 60 delete "1, further comprising:" and insert --a plate-like insulating substrate;--.

Claim 5, column 4, line 62 delete "and".

Claim 5, column 4, line 64 delete "," insert
--;
   a plurality of conductive poles including signal conductive poles and ground conductive poles, said signal and ground conductive poles being penetrated into said plate-like insulating substrate;

Wherein at least one of said signal conductive poles is surrounded by at least some of said ground conductive poles; and--.

Claim 6, column 5, line 4 after "signal" insert --and ground--, and after "poles" insert --being--.

UNITED STATES PATENT AND TRADEMARK OFFICE
CERTIFICATE OF CORRECTION

PATENT NO. : 5,331,514
DATED : July 19, 1994
INVENTOR(S) : Masao KURODA

It is certified that error appears in the above-indentified patent and that said Letters Patent is hereby corrected as shown below:

Claim 6, column 5, line 6 delete "one of said".

Claim 6, column 5, line 6 through column 6 line 1 change "is disposed between" to --are adjacently arranged with--.

Claim 6, column 6, line 1 and 2 delete "adjacently arranged" and insert --to provide shielding for said signal conductive poles and wherein each of said signal conductive poles has an impedance based on a pitch of the signal conductor poles to reduce signal reflection noise.--.

Claim 7, column 6, line 3 change "the" to --an--.

UNITED STATES PATENT AND TRADEMARK OFFICE
CERTIFICATE OF CORRECTION

PATENT NO. : 5,331,514
DATED : July 19, 1994
INVENTOR(S) : Masao KURODA

It is certified that error appears in the above-indentified patent and that said Letters Patent is hereby corrected as shown below:

Claim 7, column 6, lines 3-5 "of claim 1 wherein each of said signal conductive poles is surrounded by ground conductive poles." and insert --comprising:
  a plate-like insulating substrate;
  a plurality of conductive poles including signal conductive poles and ground conductive poles, said signal and ground conductive poles being penetrated into said plate-like insulating substrate, Wherein each of said signal conductive poles is surrounded by predetermined ground conductive poles.--.

Signed and Sealed this

Ninth Day of May, 1995

BRUCE LEHMAN

*Attest:*

*Attesting Officer*          *Commissioner of Patents and Trademarks*